United States Patent
Kim et al.

(10) Patent No.: US 9,735,627 B2
(45) Date of Patent: Aug. 15, 2017

(54) INPUT DRIVER FOR POWER AMPLIFIER AND TRANSMITTER

(71) Applicants: Samsung Electro-Mechanics Co., Ltd., Suwon-si (KR); RESEARCH & BUSINESS FOUNDATION SUNGKYUNKWAN UNIVERSITY, Suwon-si (KR)

(72) Inventors: Si Hyung Kim, Suwon-si (KR); Woo Seok Lee, Daejeon (KR); Youngoo Yang, Hwaseong-si (KR); Hwi Seob Lee, Suwon-si (KR); Chul Gyun Park, Suwon-si (KR); Sung Uk Lee, Suwon-si (KR)

(73) Assignees: Samsung Electro-Mechanics Co., Ltd., Suwon-si (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 0 days.

(21) Appl. No.: 15/001,810

(22) Filed: Jan. 20, 2016

(65) Prior Publication Data
US 2016/0241198 A1    Aug. 18, 2016

(30) Foreign Application Priority Data
Feb. 17, 2015  (KR) .................. 10-2015-0024030

(51) Int. Cl.
*H01Q 11/12* (2006.01)
*H02J 50/10* (2016.01)
(Continued)

(52) U.S. Cl.
CPC ............ *H02J 50/10* (2016.02); *H03F 1/0261* (2013.01); *H03F 3/19* (2013.01); *H03F 3/26* (2013.01);
(Continued)

(58) Field of Classification Search
CPC .... H03F 1/2011; H03F 3/19; H03F 2200/451; H03F 2200/301
(Continued)

(56) References Cited

U.S. PATENT DOCUMENTS 6,285,251 B1 * 9/2001 Dent .................. H02M 3/1582
330/124 R
7,304,537 B2 * 12/2007 Kwon .................. H03F 1/0205
330/124 R
(Continued)

FOREIGN PATENT DOCUMENTS

KR       2002-0014253 A      2/2002
KR    10-2008-0112085 A     12/2008
(Continued)

OTHER PUBLICATIONS

Korean Office Action issued on Feb. 17, 2016, in counterpart Korean Application No. 10-2015-0024030 (5 pages in English, 5 pages in Korean).

*Primary Examiner* — Sonny Trinh
(74) *Attorney, Agent, or Firm* — NSIP Law

(57) ABSTRACT

An input driver includes a power converting unit and a level adjusting unit. The power converting unit is configured to generate a first power and a second power having an anti-phase relationship based on input power, and process the first power and the second power as differential inputs to output a third power. The level adjusting unit is configured to adjust a voltage level of the third power and output the adjusted power as an input to a power amplifier.

16 Claims, 9 Drawing Sheets

(51) Int. Cl.
    *H03F 3/19*    (2006.01)
    *H03F 1/02*    (2006.01)
    *H03F 3/26*    (2006.01)

(52) U.S. Cl.
    CPC .... *H03F 2200/09* (2013.01); *H03F 2200/451* (2013.01); *H03F 2200/537* (2013.01); *H03F 2200/541* (2013.01)

(58) Field of Classification Search
    USPC ..... 330/124 R, 295, 123, 127, 199; 455/571, 455/127.1, 343.1
    See application file for complete search history.

(56) References Cited

U.S. PATENT DOCUMENTS

| | | |
|---|---|---|
| 2008/0315858 A1 | 12/2008 | Hong et al. |
| 2010/0053999 A1 | 3/2010 | Jang et al. |
| 2012/0235507 A1 | 9/2012 | Choi et al. |

FOREIGN PATENT DOCUMENTS

| | | |
|---|---|---|
| KR | 10-2010-0027528 A | 3/2010 |
| KR | 10-1373769 B1 | 3/2014 |
| KR | 10-2014-0129649 A | 11/2014 |

\* cited by examiner

INPUT DRIVER FOR POWER AMPLIFIER AND TRANSMITTER

CROSS-REFERENCE TO RELATED APPLICATION

This application claims the priority and benefit under 35 USC 119(a) of Korean Patent Application No. 10-2015-0024030 filed on Feb. 17, 2015, with the Korean Intellectual Property Office, the disclosure of which is incorporated herein by reference.

BACKGROUND

1. Field

The following description relates to an input driver and, more particularly, to an input driver for a power amplifier.

2. Description of Related Art

A transmission system to produce highly efficient wireless power transmission uses a switching mode power amplifier. In order to form such a transmission system in a single module, the transmission system is required to have a structure in which an input voltage source is generated by a quartz oscillator within the transmission system, rather than a structure in which a radio frequency (RF) input signal is externally applied.

Therefore, an input driver able to generate a level of voltage sufficient to operate the power amplifier is required within the transmission system.

Because the quartz oscillator is operated up to a maximum of 5V, a transistor requiring an input voltage level of 5V or higher requires a separate circuit or amplifier to increase voltage.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided an input driver, including: a power converting unit configured to generate a first power and a second power having an anti-phase relationship based on input power, and process the first power and the second power as differential inputs to output a third power; and a level adjusting unit configured to adjust a voltage level of the third power and output the adjusted power as an input to a power amplifier.

The power converting unit may generate the first power having the same phase as that of the input power and the second power having a phase difference of 180° with respect to the first power.

The power converting unit may further include a current buffer configured to amplify currents of the first power and the second power.

The power converting unit may include a transformer configured to receive the first power and the second power at a primary side thereof and output the third power to a secondary side thereof.

The power converting unit may receive the differential voltages, which are obtained by inverting the first power and the second power, convert voltage waveforms into the single-ended voltage waveform with a voltage swing from $-V_{CC}$ to $+V_{CC}$ on the basis of 0V, and output the single-ended voltage waveform using the transformer.

The level adjusting unit may include a clamp circuit configured to adjust the voltage level of the third power using a diode.

The diode may be a zener diode.

The level adjusting unit may adjust a lower voltage level of the third power to 0V.

The power converting unit may include a first power converting unit configured to generate the first power and the second power, and a second power converting unit configured to receive the first power and the second power through the current buffer, convert the first power and the second power output through the current buffer into the third power, and output the third power to the level adjusting unit.

In accordance with another embodiment, there is provided a transmitter, including: a power amplifier; and an input driver including a power converting unit configured to generate a first power and a second power having an anti-phase relationship based on input power, and process the first power and the second power as differential inputs to output a third power, and a level adjusting unit configured to adjust a voltage level of the third power and output the adjusted power as an input to the power amplifier.

The power amplifier may include a switching mode power amplifier.

The power converting unit may generate the first power having the same phase as that of the input power and the second power having a phase difference of 180° with respect to the first power.

The power converting unit may include a first power converting unit configured to generate the first power and the second power, and a second power converting unit configured to receive the first power and the second power at a primary side of a transformer and output the third power to a secondary side of the transformer.

The power converting unit may further include a current buffer configured to amplify currents of the first power and the second power.

The level adjusting unit may include a clamp circuit configured to adjust the voltage level of the third power using a diode.

The diode may be a zener diode.

Other features and aspects will be apparent from the following detailed description, the drawings, and the claims.

BRIEF DESCRIPTION OF DRAWINGS

These and/or other aspects will become apparent and more readily appreciated from the following description of the embodiments, taken in conjunction with the accompanying drawings in which.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Because an input driver, according to various embodiments, provides input power for a power amplifier using a transformer and a clamp circuit, the various embodiments do not need to have a separate voltage source, and input voltage matched to characteristics of the power amplifier is applied. As a result, an efficiency of the power amplifier is improved.

Because the input driver, according to various embodiments, uses a clamp circuit using a zener diode, the input driver adjusts a level of voltage input to the power amplifier and accordingly realizes highly efficient operation of the power amplifier or a transistor.

The input power of the input driver is generated by a quartz oscillator, and the quartz oscillator is operated up to a specific voltage, such as a maximum of 5V. Therefore, the transistor or the power amplifier requiring the input voltage of 5V or higher needs a separate circuit or amplifier to increase the voltage.

In a case in which the separate circuit or amplifier to increase the voltage is added to the input driver, circuit complexity may also be increased, and another voltage source for an additional operation of the circuit may also be required.

The input driver, according to various embodiments, realizes highly efficient operation of the power amplifier, without a separate voltage source. An operation thereof will be described with reference to FIGS. 1 through 11.

Figure 1:
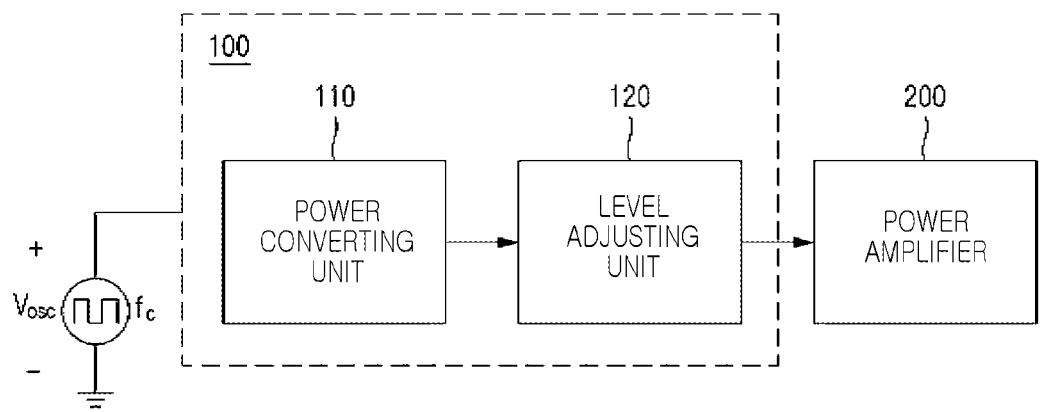
FIG. 1 is a view illustrating a configuration of an input driver, according to an embodiment.

FIG. 1 is a view illustrating a configuration of an input driver, according to an embodiment.

Referring to FIG. 1, an input driver 100, according to an embodiment includes a power converting unit 110 and a level adjusting unit 120.

The power converting unit 110 is a converter and processor configured to generate a first power and a second power using input power $V_{OSC}$ and converts the first power and the second power into third power and output the converted power.

The level adjusting unit 120 is a processor configured to adjust a voltage level of the third power converted by the power converting unit 110 and provide the voltage level of the third power to a power amplifier 200. The level adjusting unit 120 adjusts the voltage level of the third power by adding a level of direct current voltage to the third power.

In an example, the level adjusting unit 120 adjusts the voltage level of the third power by adjusting a lower voltage level of the third power to 0V.

The input driver, according to an embodiment, is described in detail with reference to FIGS. 2 through 9.

Figure 2:
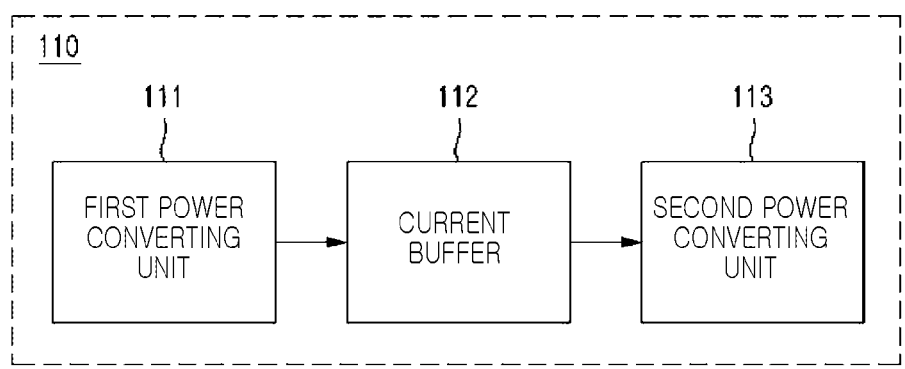
FIG. 2 is a view illustrating an example of a configuration of a power converting unit illustrated in FIG. 1.

FIG. 2 is a view illustrating an example of a configuration of the power converting unit 110 illustrated in FIG. 1.

Referring to FIG. 2, the power converting unit 110 includes a first power converting unit 111, a current buffer 112, and a second power converting unit 113.

The first power converting unit 111 is a processor configured to receive input power, which is power output from a quartz oscillator, and, based on the input power, generate the first power and the second power having an anti-phase relationship, which describes a difference in phase of 180°.

In an example, the first power converting unit 111 generates the input power as the first power and the second power having differential voltages, where the first power and the second power have a phase difference of 180°.

The quartz oscillator is used to generate a voltage waveform to operate the transistor or the power amplifier in a transmission system. Because the power generated by the quartz oscillator has a voltage waveform within 5V, for instance, the first power converting unit 111 generates the first power and the second power having the differential voltages in order to generate a voltage to be used by the power amplifier.

Figure 3:
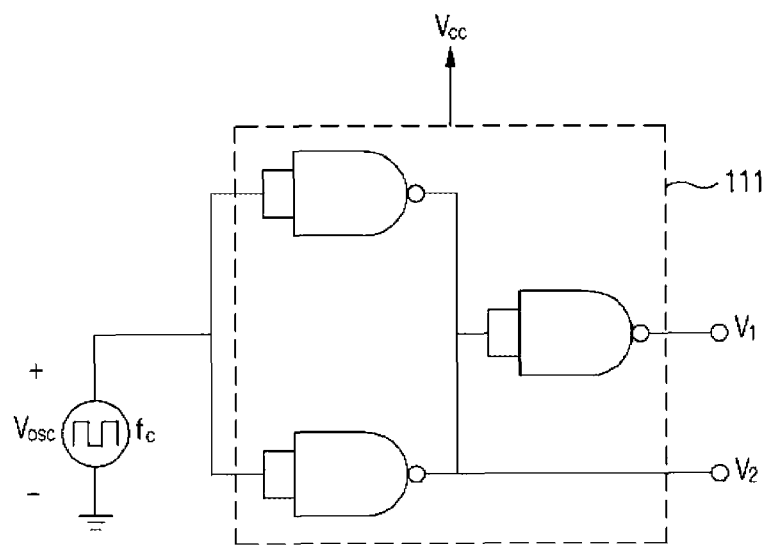
FIG. 3 is a view illustrating an example of a configuration of a first power converting unit illustrated in FIG. 2.

For example, as illustrated in FIG. 3, the first power converting unit 111 divides the output voltage of the quartz oscillator, that is, the input power into two paths, generates a first power $V_1$ using two inverters provided in one path, and generates a second power $V_2$ using one inverter provided in the other path, thereby converting the input power into the first power $V_1$ and the second power $V_2$ having differential voltages.

In an example, the first power converting unit 111 is a single structural element that connects two inputs of a four-input NAND circuit to each other. In an alternative embodiment, the first power converting unit 111 are structural elements that connect two inputs of a four-input NAND circuit to each other.

Figure 4:
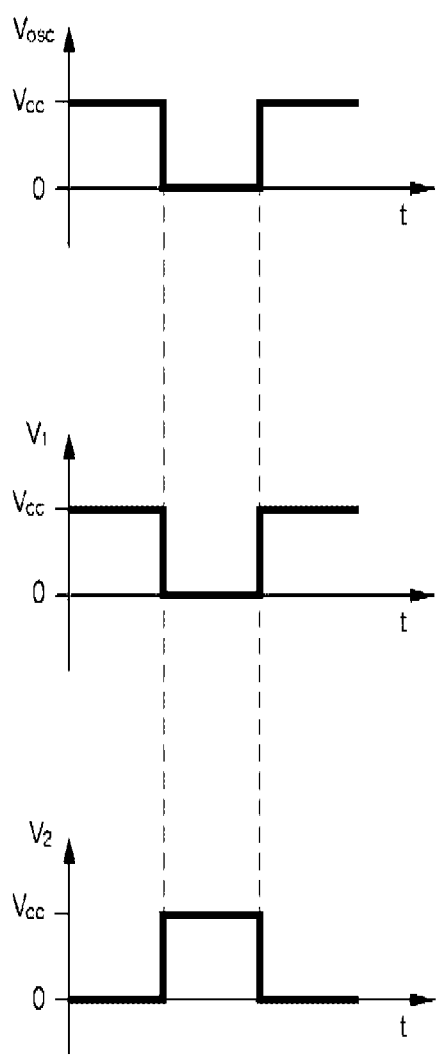
FIG. 4 illustrates a waveform diagram of input power and output power of the first power converting unit illustrated in FIG. 3.

As illustrated in FIG. 4, the first power $V_1$ generated at the first power converting unit 111 has the same waveform as that of an output voltage $V_{OSC}$ of the quartz oscillator. The second power $V_2$ has a waveform in which a lower voltage level and an upper voltage level of the first power $V_1$ are inverted. As a result, the first power $V_1$ and the second power $V_2$ have a phase difference of 180°. That is, if an operation voltage $V_{CC}$ of the quartz oscillator is applied, the output voltage $V_{OSC}$ has a pulse form of a predetermined frequency fc. The quartz oscillator generates the amplitude of the operation voltage $V_{CC}$. The first power converting unit 111 generates the first power $V_1$ having the same waveform as that of the output voltage $V_{OSC}$ by the two inverters using the output voltage $V_{OSC}$ of the quartz oscillator. The first power converting unit 111 also generates the second power $V_2$ having an inverted waveform compared with that of the first power $V_1$ and the output voltage $V_{OSC}$ by one inverter using the output voltage $V_{OSC}$.

The first power converting unit 111 also generates the first power and the second power so that positions of the first power and the second power may vary in accordance with various applications and depending on a connection relationship between the first and second power converting units 111 and 113 and whether or not the current buffer 112 is present.

Figure 5:
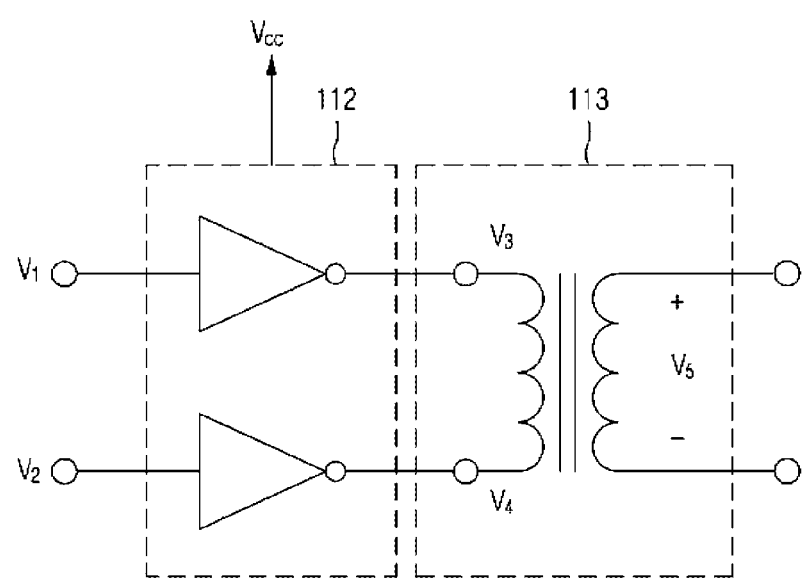
FIG. 5 is a view illustrating an example of a configuration of a current buffer and a second power converting unit illustrated in FIG. 1.

The current buffer 112 is a processor configured to supply sufficient current to drive the transistor or the power amplifier, and includes two inverters as in the example illustrated in FIG. 5. In an alternative configuration, the current buffer 112 may include one to multiple inverters.

The current buffer 112 amplifies currents of the first power $V_1$ and the second power $V_2$ to provide the amplified currents to the second power converting unit 113.

Figure 6:
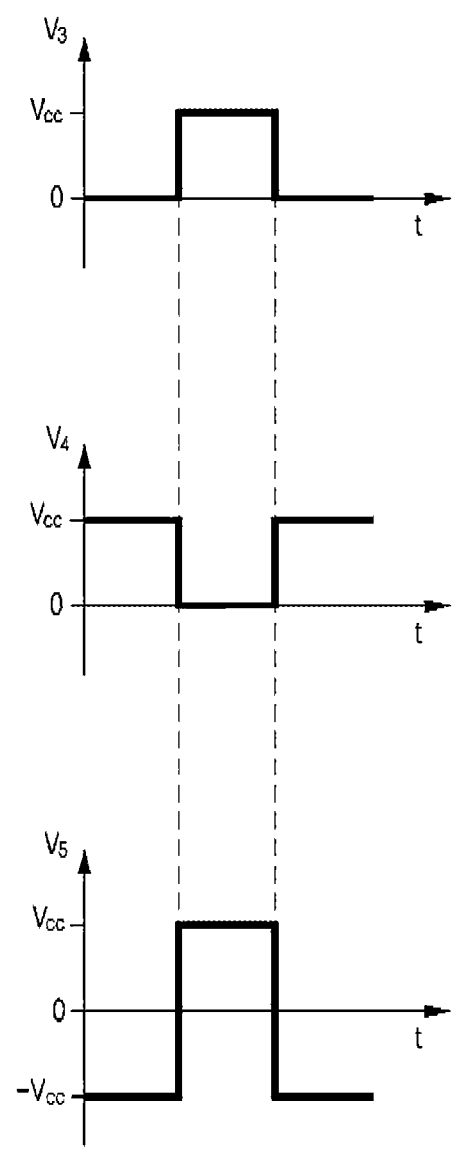
FIG. 6 illustrates a waveform diagram of input power and output power of the second power converting unit illustrated in FIG. 5.

In an example, because the current buffer 112 including the two inverters inverts differential voltages $V_1$ and $V_2$ to output voltages $V_3$ and $V_4$ as illustrated in FIG. 6, a differential voltage waveform is maintained.

The current buffer 112 includes two buffers in a case in which the positions of the first power and the second power generated by the first power converting unit 111 are changed. In an alternative configuration, the current buffer 112 may include one to multiple buffers.

In some cases, the current buffer 112 may also be omitted.

The second power converting unit 113 receives the first power and the second power generated by the first power converting unit 111 through the current buffer 112, converts the first power and the second power output through the current buffer 112 into the third power, and outputs the third power to the level adjusting unit 120.

In accordance with an embodiment, the second power converting unit 113 converts two powers of the first power converting unit 111 output through the current buffer 112 into one power to output the converted power, and includes a transformer having a primary side of which both ends receive the first power and the second power and a secondary side through which the third power corresponding to the first power and the second power is output.

For example, the second power converting unit 113 converts the differential voltage waveforms $V_3$ and $V_4$ into a single-ended voltage waveform $V_5$ and outputs the single-ended voltage waveform $V_5$ using the transformer, as in the example illustrated in FIG. 5.

In an embodiment, as illustrated in FIG. 6, the second power converting unit 113 receives the differential voltages $V_3$ and $V_4$, which are obtained by inverting the first power $V_1$ and the second power $V_2$ from the current buffer 112, and converts the voltage waveforms $V_3$ and $V_4$ into the single-ended voltage waveform $V_5$ with a voltage swing from $-V_{CC}$ to $+V_{CC}$ on the basis of 0V. The second power converting unit 113 outputs the voltage waveform $V_5$ using the transformer.

After a level of the voltage of the single-ended waveform converted, as described above, is adjusted by the level adjusting unit 120, the voltage of the single-ended waveform is provided as the input voltage of the transistor or the power amplifier.

The level adjusting unit 120 is configured from a clamp circuit in which a capacitor and a diode are connected to each other. A description thereof will be provided with reference to FIGS. 7 and 8.

Figure 7:
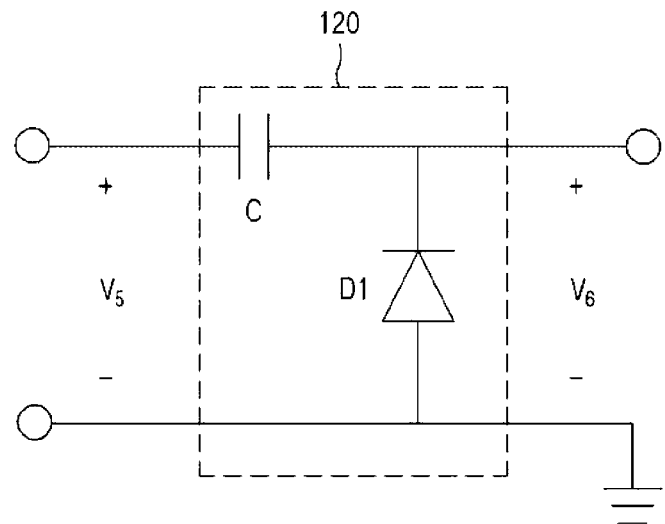
FIG. 7 is a view illustrating an example of a configuration of a level adjusting unit illustrated in FIG. 1.

FIG. 7 is a view illustrating an example of a configuration of the level adjusting unit illustrated in FIG. 1.

As illustrated in FIG. 7, the level adjusting unit 120 includes a capacitor C connected in series between an output terminal of the second voltage converting unit 113 and an input terminal of the power amplifier, and a diode D1 connected in parallel to the input terminal of the power amplifier to adjust a lower voltage level of the input power $V_5$ to 0V and output power $V_6$ having an adjusted level to the power amplifier.

Figure 9:
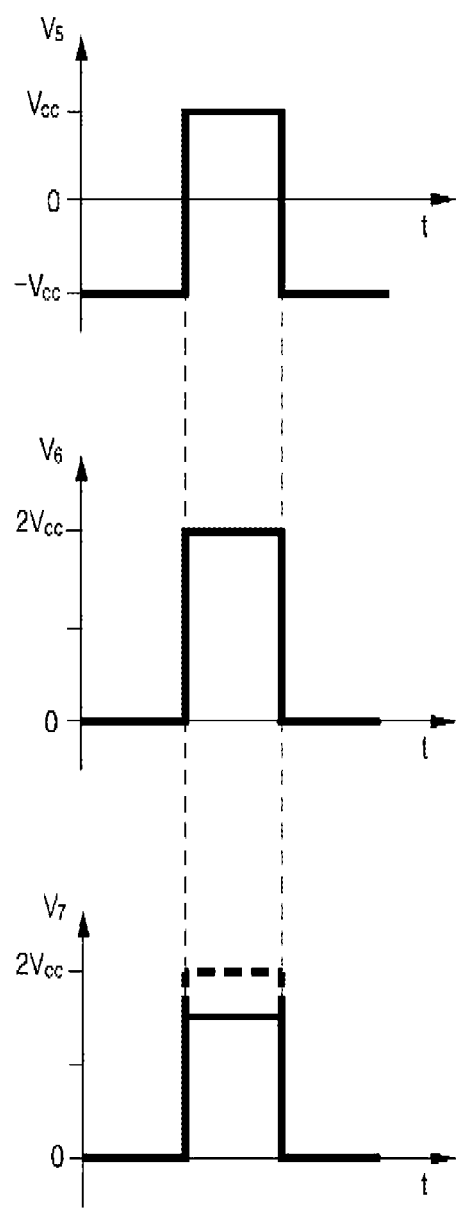
FIG. 9 illustrates a waveform diagram of an input terminal and an output terminal illustrated in FIGS. 7 and 8.

That is, the level adjusting unit 120 of FIG. 7 prevents an output voltage of the power $V_5$ with a voltage swing from $-V_{CC}$ to $+V_{CC}$, as illustrated in FIG. 9, from being decreased to be equal to or lower than 0V by the diode D1, and does not limit amplitude $2V_{CC}$ of the power $V_5$. Therefore, the level adjusting unit 120 of FIG. 7 adjusts a level of the power $V_5$ with a voltage swing from $-V_{CC}$ to $+V_{CC}$ to a level of the power $V_6$ with a voltage swing from 0V to $+2V_{CC}$ and outputs the adjusted level of power $V_6$.

Therefore, the level adjusting unit 120 of FIG. 7 sets the lowest level to be 0V and adjusts the level of the power to have a voltage swing in a positive region, while having the same amplitude as that of the input power.

Figure 8:
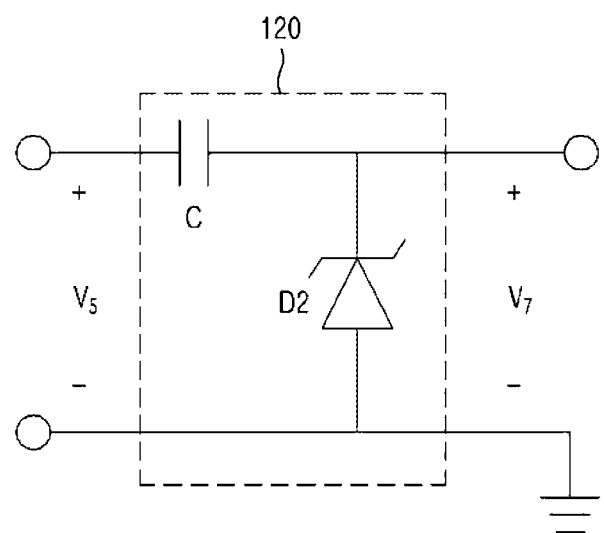
FIG. 8 is a view illustrating another example of a configuration of a level adjusting unit illustrated in FIG. 1.

FIG. 8 is a view illustrating another example of a configuration of the level adjusting unit illustrated in FIG. 1, wherein the diode D1 in the configuration of FIG. 7 is replaced by a zener diode D2.

As illustrated in FIG. 8, the level adjusting unit 120 includes the capacitor C connected in series between the output terminal of the second voltage converting unit 113 and the input terminal of the power amplifier. The level adjusting unit 120 also includes a zener diode D2 connected in parallel to the input terminal of the power amplifier to adjust the lower voltage level of the input power $V_5$ to 0V and output power $V_7$ having an adjusted level to the power amplifier.

That is, the level adjusting unit 120 of FIG. 8 prevents the output voltage of the power $V_5$ swinging from $-V_{CC}$ to $+V_{CC}$, as illustrated in FIG. 9, from being decreased to be equal to or lower than 0V by the zener diode D2. The level adjusting unit 120 also adjusts the amplitude $2V_{CC}$ of the power $V_5$ by a breakdown voltage. Therefore, the level adjusting unit 120 of FIG. 8 adjusts a level of the power $V_5$ with a voltage swing from $-V_{CC}$ to $+V_{CC}$ to a level of power $V_7$, with a voltage swing from 0V to a difference, such as, $2V_{CC}$—breakdown voltage, between $+2V_{CC}$ and the breakdown voltage of the zener diode and outputs the adjusted level of power $V_7$.

As such, the level adjusting unit of FIG. 8 sets the lowest voltage level to be 0V and adjusts a level of voltage input to the transistor or the power amplifier depending on the breakdown voltage of the zener diode D2. As a result, by selecting the zener diode according to the level of the input voltage required by the transistor or the power amplifier, highly efficient operation of the transistor or the power amplifier is realized.

As described above, the input driver is a structural component that generates the level of the input voltage suitable for highly efficient operation of a switching mode power amplifier. It may be seen from the input driver, according to an embodiment, that the quartz oscillator and respective structural components configuring the input driver are all operated by a signal voltage source of the same voltage $V_{CC}$.

An additional circuit or amplifier, or a separate DC voltage source to drive the input driver is not required.

In addition, the input driver, according to an embodiment, increases the level of the input voltage of the power amplifier to a positive voltage level from 0V to an amplitude of an AC voltage waveform by using the clamp circuit, including the capacitor and the diode, without a separate amplifier to increase the voltage level to generate the input voltage necessary to operate the transistor. As a result, a highly efficient operation of the power amplifier is realized.

In addition, because the input driver, according to an embodiment, obtains highly efficient operation of the power amplifier by the simple circuit configuration, manufacturing costs of the input driver and circuit complexity are reduced.

Furthermore, the input driver, according to an embodiment, adjusts the upper voltage level of the input voltage input to the power amplifier depending on the breakdown voltage of the zener diode by using the zener diode as the diode of the clamp circuit. As a result, the input driver provides an appropriate input voltage that matches characteristics of the transistor or the power amplifier.

Figure 10:
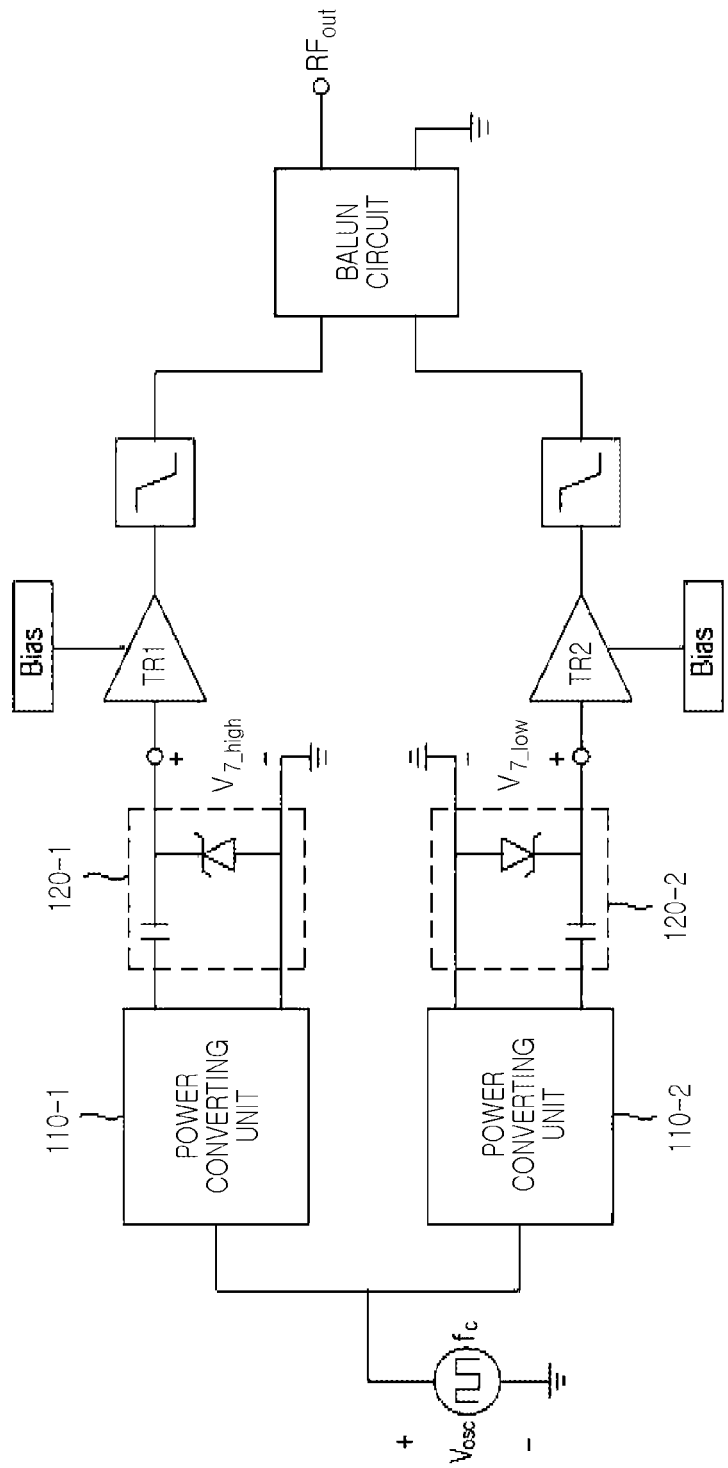
FIG. 10 is a view illustrating a power amplifier having a differential structure to which an input driver is applied, according to an embodiment.

FIG. 10 is a view illustrating a power amplifier having a differential structure to which an input driver, according to an embodiment.

As illustrated in FIG. 10, two power converting units 110 and 120, according to an embodiment, are arranged in two symmetrical structures, to be used for the power amplifier having a differential structure, such as a Class-D power amplifier. In an example, because a balun circuit and a filter illustrated in FIG. 10 are well known to those skilled in the art, a description thereof will be omitted.

Figure 11:
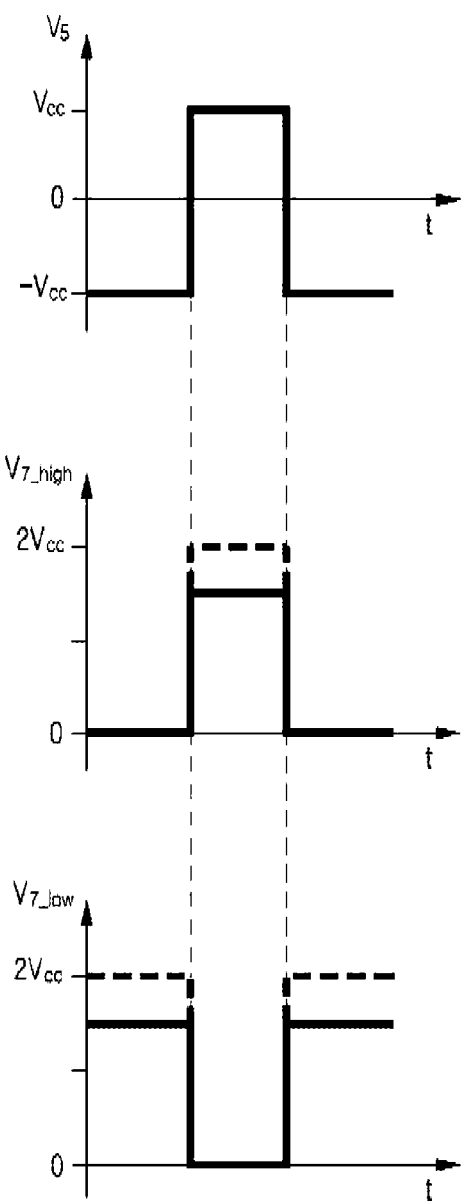
FIG. 11 illustrates a waveform diagram of input power of the power amplifier illustrated in FIG. 10.

In addition, as illustrated in a waveform diagram of FIG. 11, a voltage $V_{7\_high}$ of the input driver connected to a transistor TR1 is a voltage of output power adjusted with respect to the power $V_5$ with a voltage swing from $-V_{CC}$ to $+V_{CC}$ input to a second power converting unit 120-1. The voltage $V_{7\_high}$ of the input driver is clamped by the zener diode at an amplitude between 0V and $2V_{CC}$. A voltage $V_{7\_low}$ of the input driver connected to a transistor TR2 is a voltage of output power adjusted with respect to the power $V_5$ with a voltage swing from $-V_{CC}$ to $+V_{CC}$ input to a second power converting unit 120-2. The voltage $V_{7\_low}$ of the input driver has a phase opposing that of $V_{7\_high}$, while having the same amplitude as that of $V_{7\_high}$.

Therefore, the input driver, according to an embodiment, may also be applied to an input voltage waveform to drive the power amplifier of the differential structure.

As such, the input driver, according to an embodiment, may also drive the power amplifier having the differential structure such as the Class-D power amplifier by using two second power converting units, such as the clamp circuit in the symmetrical structure.

In addition, it is apparent to those skilled in the art that the input driver according to an embodiment, may be applied to a power amplifier for wireless power transmission, such as the switching mode power amplifier, and may also be applied to a transmission system or a transmitter including the power amplifier.

As set forth above, the input driver, according to various embodiments, may be applied to all products using an input driver for a power amplifier, and may be applied to a transmitter performing wireless power transmission.

According to various embodiments, because the input driver, including the transformer and the clamp circuit, is used, a separate voltage source is not required. The input driver produces the input voltage matched to characteristics of the transistor to improve the efficiency of the power amplifier.

The apparatuses, units, modules, devices, and other components illustrated in FIGS. 1-11 are implemented by hardware components. Examples of hardware components include controllers, sensors, generators, drivers, filters, buffers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An input driver, comprising:
a power converting unit configured to generate a first power and a second power having an anti-phase relationship based on input power, and process the first power and the second power as differential inputs to output a third power; and
a level adjusting unit configured to adjust a voltage level of the third power and output the adjusted power as an input to a power amplifier.

2. The input driver of claim 1, wherein the power converting unit generates the first power having the same phase as that of the input power and the second power having a phase difference of 180° with respect to the first power.

3. The input driver of claim 1, wherein the power converting unit further comprises a current buffer configured to amplify currents of the first power and the second power.

4. The input driver of claim 3, wherein the power converting unit comprises
a first power converting unit configured to generate the first power and the second power, and
a second power converting unit configured to receive the first power and the second power through the current buffer, convert the first power and the second power output through the current buffer into the third power, and output the third power to the level adjusting unit.

5. The input driver of claim 1, wherein the power converting unit comprises a transformer configured to receive the first power and the second power at a primary side thereof and output the third power to a secondary side thereof.

6. The input driver of claim 5, wherein the power converting unit receives the differential voltages, which are obtained by inverting the first power and the second power, converts voltage waveforms into the single-ended voltage waveform with a voltage swing from $-V_{CC}$ to $+V_{CC}$ on the basis of 0V, and outputs the single-ended voltage waveform using the transformer.

7. The input driver of claim 1, wherein the level adjusting unit comprises a clamp circuit configured to adjust the voltage level of the third power using a diode.

8. The input driver of claim 7, wherein the diode is a zener diode.

9. The input driver of claim 1, wherein the level adjusting unit adjusts a lower voltage level of the third power to 0V.

10. A transmitter, comprising:
a power amplifier; and
an input driver comprising
a power converting unit configured to generate a first power and a second power having an anti-phase relationship based on input power, and process the first power and the second power as differential inputs to output a third power, and
a level adjusting unit configured to adjust a voltage level of the third power and output the adjusted power as an input to the power amplifier.

11. The transmitter of claim 10, wherein the power amplifier comprises a switching mode power amplifier.

12. The transmitter of claim 10, wherein the power converting unit generates the first power having the same phase as that of the input power and the second power having a phase difference of 180° with respect to the first power.

13. The transmitter of claim 12, wherein the power converting unit further comprises a current buffer configured to amplify currents of the first power and the second power.

14. The transmitter of claim 10, wherein the power converting unit comprises
a first power converting unit configured to generate the first power and the second power, and
a second power converting unit configured to receive the first power and the second power at a primary side of a transformer and output the third power to a secondary side of the transformer.

15. The transmitter of claim 10, wherein the level adjusting unit comprises a clamp circuit configured to adjust the voltage level of the third power using a diode.

16. The transmitter of claim 15, wherein the diode is a zener diode.

* * * * *